SEMICONDUCTOR DEVICE HAVING A SULFUR-TREATED SILICON COMPOUND THEREON AND A METHOD OF MAKING THE SAME

Filed Jan. 31, 1968 4 Sheets-Sheet 1

INVENTORS
MINORU ONO, MINORU NUJITA,
TOSHIMITU MOMOI, ISAMU HOMMA

BY Craig & Antonelli
ATTORNEYS

VARIATION OF DRAIN CURRENT CHARACTERISTICS DUE TO FFC (320°C) TREATMENT

INVENTORS
MINORU ONO, MINORU HUJITA
TOSHIMITU MOMOI, ISAMU HOMMA

BY Craig & Antonelli
ATTORNEYS

INVENTORS
MINORU ONO, MINORU HUJITA,
TOSHIMITU MOMOI, ISAMU HOMMA

BY Craig & Antonelli
ATTORNEYS

INVENTORS
MINORU ONO, MINORU HUJITA,
TOSHIMITU MOMOI, ISAMU HOMMA

BY Craig & Antonelli
ATTORNEYS

United States Patent Office 3,474,310

Patented Oct. 21, 1969

3,474,310

SEMICONDUCTOR DEVICE HAVING A SULFUR-TREATED SILICON COMPOUND THEREON AND A METHOD OF MAKING THE SAME

Minoru Ono and Minoru Hujita, Kodaira-shi, Toshimitu Momoi, Tokyo, and Isamu Homma, Hokkaido, Japan, assignors to Hitachi, Ltd., Tokyo, Japan, a corporation of Japan Filed Jan. 31, 1968, Ser. No. 701,990
Claims priority, application Japan, Feb. 3, 1967, 42/6,607
Int. Cl. H01l *11/00, 7/44;* B44d *1/20*
U.S. Cl. 317—235 30 Claims

ABSTRACT OF THE DISCLOSURE

A semiconductor device, for example, and MOS type effect transistor wherein the surface of a silicon compound film such as silicon oxide or silicon nitride covering a semiconductor body is exposed to, for example, undiluted sulfuric acid, sulfurous acid or benzene sulfonic acid, and an electrode of aluminum for example is connected on the thus treated surface of the silicon compound film.

BACKGROUND OF THE INVENTION

This invention relates to a semiconductor device composed of a semiconductor substrate whose surface characteristics are controlled and a method of making such a semiconductor device.

Conventionally, techniques to passivate a semiconductor substrate surface by covering the same with a film of silicon compounds, glass, etc. are known. Coating of the active substrate surface with such a passivation film contributes to the improvement and stabilization of the electrical characteristics of a semiconductor device made of such a substrate. Recent investigations show that a passaviation film itself imposes an important influence on the semiconductor substrate surface. For example, when a silicon oxide film is formed on a silicon semiconductor substrate surface by a thermal growth method or a pyrolytic decomposition method, said film has a tendency to turn the substrate surface thereunder into N conductivity type. Namely, an N type inversion layer is induced by silicon oxide in a high resistivity P type semiconductor substrate surface layer. Said inversion layer is sometimes called a channel layer and is undesirable in a bipolar transistor since it increases the leakage current. However, in an MOS field effect transistor, said inversion layer is effectively utilized as a majority carrier path. Since a silicon semiconductor material and silicon dioxide are the main materials for making a PNP bipolar transistor and an N channel enhancement mode MOSFET at present, control of the generation of said channel is an important subject. As is well known, in order to prevent the channel from being generated, semiconductor substrate is heavily doped with an acceptor impurity to form a low resistivity region on the semiconductor substrate surface in such transistors. This method, however, requires a high precision diffusion technique and is therefore inconvenient. Further, in case of said MOSFET, the method causes the lowering of mutual conductance $g_m$ and drain breakdown voltage due to the lowering of mobility of carrier in the channel.

Another method of channel control, wherein alkali ions are introduced into silicon oxide, has been proposed, but according to this method, ions move easily in said oxide film and the electrical characteristics are easily varied.

From these considerations, it is understood that a passivation film which protects a semiconductor substrate surface from the outer atmosphere and which is stable in itself and more preferably a film whose tendency to become N type is small is required in the field of interest.

SUMMARY OF THE INVENTION

An object of this invention is to provide a novel semiconductor device whos surface properties are controlled.

Another object of the invention is to provide a method of forming on a semiconductor surface a stable insulating passivation film whose tendency to turn to N type is small.

A further object of the invention is to provide a preferable method of properly controlling the energy state of a semiconductor surface.

The purport of this invention consists in controlling the conductivity distribution or the energy state of a substrate surface by introducing sulphur into a surface passivation film formed on a semiconductor surface.

According to an embodiment of the invention, the film subjected to sulphur treatment is further subjected to charging treatment. Thereby, the bending of the energy band at the surface becomes better controlled.

DESCRIPTION OF THE PREFERRED EMBODIMENTS

In the first place, a standard method of semiconductor treatment according to an embodiment of this invention will be described with reference to FIGS. 1*a* to 1*f* by taking a method of making an MOSFET as an example. In this embodiment, a silicon semiconductor and silicon oxide are dealt with as an example, but it is possible to use other semiconductors like germanium, intermetallic compounds, etc. and to use silicon nitride instead of silicon oxide.

Figure 1A:
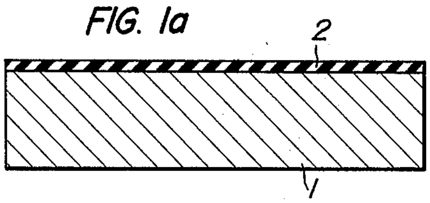
FIGS. 1*a* to 1*f* and FIGS. 2*a* to 2*d* are sectional diagrams of a semiconductor wafer illustrating the manufacturing process of an MOSFET according to different embodiments of this invention.
Figure 1B:
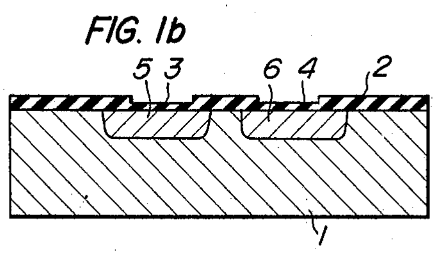
Figure 1C:
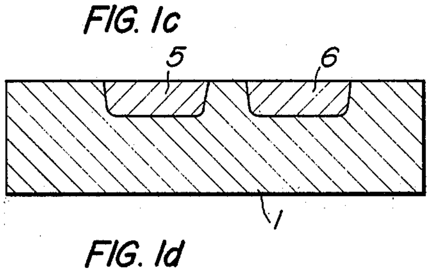
Figure 1D:
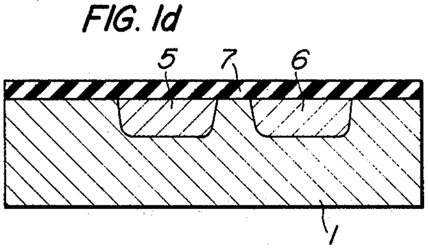
Figure 1E:
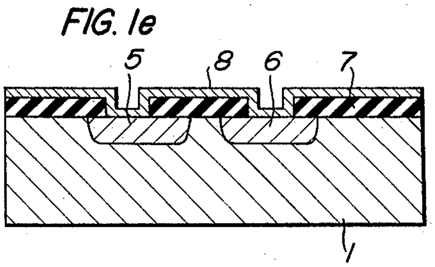
Figure 1F:
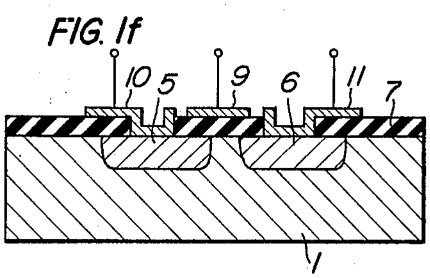
Figure 3:
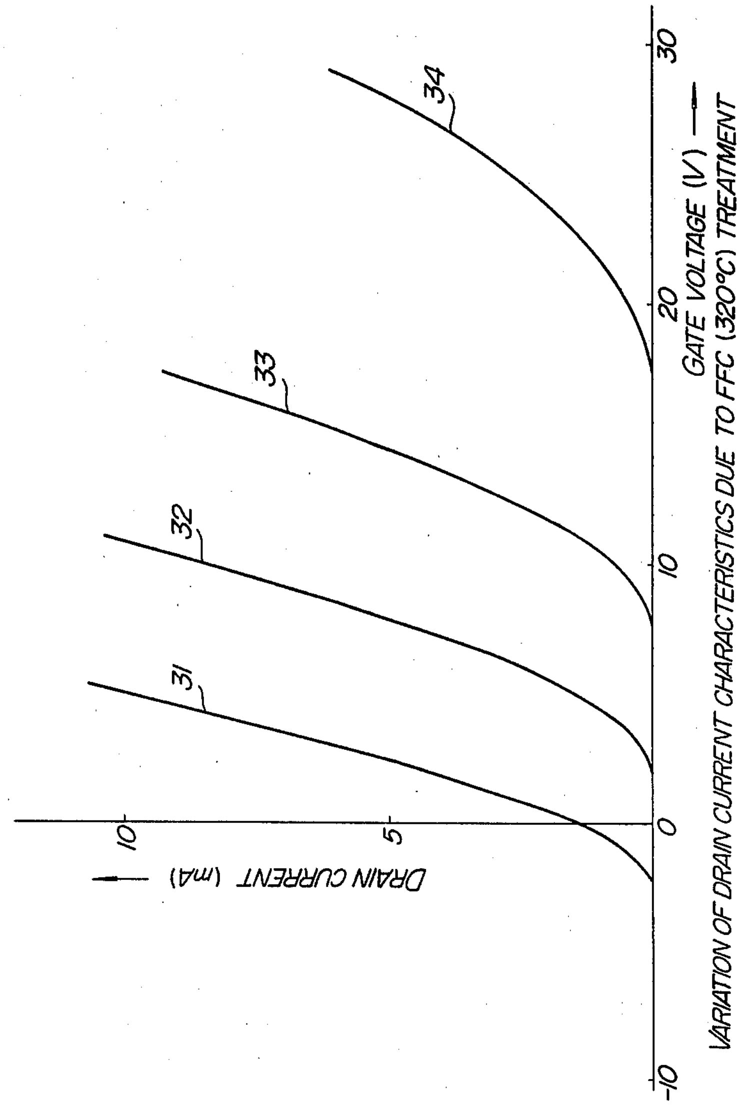
FIGS. 3 and 4 are a drain current vs. gate voltage characteristic diagram and a characteristic diagram showing the variation of a threshold voltage with time of an MOSFET obtained according to an embodiment of the invention.

As shown in FIG. 1*a*, an $SiO_2$ film 2 is formed on the surface of a P type high resistivity silicon substrate 1 having a specific resistance of 12–15Ω cm. by placing said substrate in wet $O_2$ atmosphere and heating the substrate at about 1000° C. for 2–3 hours. Then, as shown in FIG. 1*b*, a part of the $SiO_2$ film 2 is etched away to expose the predetermined substrate surface part and phosphorous is diffused into said exposed surface for about five minutes at about 1000° C. by using $POCl_3$ gas to form N type regions 5 and 6. Said regions 5 and 6 work as a source region and a drain region, respectively. At the time of said diffusion treatment, novel oxide films 3 and 4 are formed on said respective regions. Then, as shown in FIG. 1*c* all of the $SiO_2$ films 2, 3, 4 are eliminated and the substrate surface is exposed. The exposed substrate surface is exposed to wet $O_2$ gas maintained at about 1000° C. for about 20 minutes and then to dry $O_2$ gas maintained at the same temperature for aboua 40 minutes to form a new oxide film 7 of about 1000 to 3000 A. on said surface, as shown in FIG. 1*d*. Then, holes for setting source and drain electrodes are formed on the oxide film 7 by use of the well-known photoetching technique. The photoresist film used when forming the holes on the oxide film 7 is then eliminated to expose the oxide film surface. The exposed surface is dipped into undiluted sulfuric acid at 100° C. for 10 minutes. Then, the treated surfaces are cleaned with pure water. An aluminum layer is deposited on the cleaned oxide film surface. At this time, aluminum layers are formed in the source and drain regions through the holes formed previously, as shown in FIG. 1*e*. It is thought that sulphur is adhered to or introduced into the $SiO_2$ film under the aluminum layer 8 shown in FIG. 1*e*. As shown in FIG. 1*f*, aluminum layers, except a source electrode 10 and a drain electrode 11, each lying on a source region 5 and a drain region 6, respectively, and a gate electrode 9 provided on the film 7 between the source region 5 and the drain region 6, are eliminated. Said selective elimination of the aluminum layers is done by use of photoetching technique. The elimination of the photoresist film is performed by heating the film in benzene sulfonic acid at about 140° C. for 5 minutes. The surface from which the photoresist film is etched away with benzene sulfonic acid is cleaned with propyl alcohol. At this stage, the drain current versus gate voltage characteristic (drain voltage $V_D=10$ volts, constant) is measured to give the result as shown by curve 31 in FIG. 3. Then, electrothermic treatment, such as well known field-cooling treatment or bias-temperature method, is done by maintaining the wafer in a dry atmosphereat 320° C. for about 30 minutes while applying a predetermined voltage between the gate electrode 9 and the substrate 1 in a way that the gate may become negative. Curves 32, 33 and 34 of FIG. 3 show the relation between the drain current and the gate voltage when a voltage of 20 v., 40 v. and 60 v. are applied between the gate electrode and the substrate during said treatment, respectively. It will be understood from FIG. 3 that the threshold voltage $V_{th}$ ($V_{th}$ is the gate voltage at which the drain current begins flowing through the channel) is moved in a positive direction by said electrothermic treatment and an N-channel depletion mode FET is converted into an N-channel enhancement mode FET. It is to be noted here that an N-channel enhancement mode MOSFET can not be obtained from a MOSFET not subjected to undiluted sulfuric acid treatment even if the electrothermic treatment is done.

Figure 4:
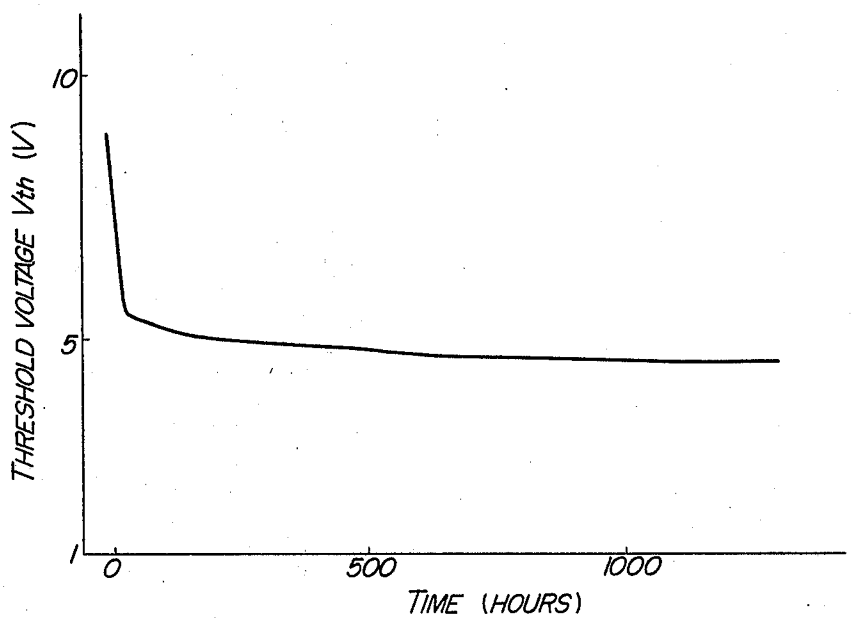

Thus, an N-channel enhancement mode FET having a desired threshold voltage is obtained. The result of measurement of a high temperature characteristic of said FET measured by placing the transistor in air at 150° C. is shown in FIG. 4. FIG. 4 shows the result of the threshold voltage $V_{th}$ of the FET shown by curve 33 in FIG. 3 measured at a predetermined time interval under the condition that the drain voltage $V_D=10$ v., and the drain current $I_D=10\mu A$. It is seen from FIG. 4 that the threshold voltage goes to a stable stationary state after a certain transient time. It is needless to mention that the time interval of said electrothermic treatmen, the temperautre, the voltage and he polarity can be chosen suitably.

Now, another embodiment of this invention will be described hereinbelow.

The surface of an oxide film is exposed to sulphurous acid gas for 5–10 minutes instead of said undiluted sulfuric acid treatment, then subjected to electrothermic treatment after an aluminum evaporation treatment and an N-channel enhancement mode MOSFET similar to the one obtained by sulfuric acid treatment is provided. Actually, however, a better result is obtained if the element is subjected to heat-treatment for several tens of minutes in $H_2$, $O_2$ or $N_2$ atmosphere of 400°–500° C. for making sulphur imerse sufficiently into the $SiO_2$ film.

According to a further embodiment of this invention, benzene sulfonic acid is used instead of said undiluted sulfuric acid or sulphurous acid gas. An $SiO_2$ film is exposed to benzene sulfonic acid heated to about 160° C. for about 5 minutes. Then, superfluous benzene sulfonic acid is eliminated from the $SiO_2$ surface by using propyl alcohol or ethyl alcohol. Also in this enmbodiment, the heat treatment in said gas is performed when necessary. Then, a desired MOSFET is provided by aluminum evaporation and electrothermic treatments.

According to a further embodiment of the invention, a corona discharge or a special evaporator is used together with or instead of said electrothermic treatment. The electrothermic treatment, the corona discharge treatment and the special evaporator all aim at charging the $SiO_2$ film.

Figure 5:
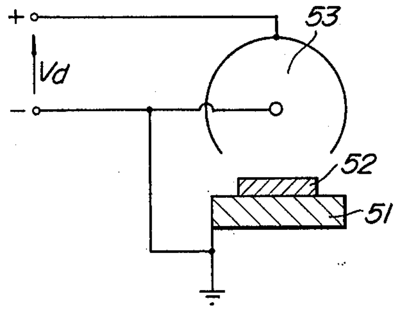
FIG. 5 is a schematic electrical circuit diagram of a discharge device used in another embodiment of the invention.
Figure 6:
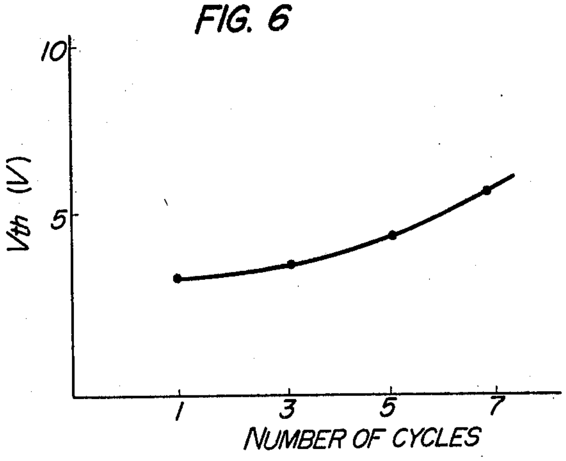
FIG. 6 is a diagram showing the variation of a threshold voltage of an MOSFET subjected to sulphurous acid gas treatment according to this invention as a function of the number of said treatments.

Before the evaporation treatment for forming aluminum electrodes, a negative charge is accumulated on the upper surface of the $SiO_2$ film of a sample 52 with a corona discharger 53 for about 5 minutes as shown in FIG. 5. If this treatment is done, an N-channel enhancement mode MOSFET is obtained even without the following electrothermic treatment. Further, a good result is obtained when said charging method using said corona discharge is combined with the sulphurous acid gas treatment. Namely, a sequence of treatments consisting of the sulphurous acid gas treatment, the charging treatment with a corona discharger and the heat-treatment are applied to the $SiO_2$ film. Then, electrodes are formed by an evaporation treatment and a photoetching treatment and an MOSFET is completed. Repetition of said sequence of treatments increases the threshold voltage and the voltage becomes larger with the number of repetitions are shown in FIG. 6. It will be evident that the FET shown in FIG. 6 is an enhancement mode FET.

The special deposition treatment is done with an evaporator comprising means for giving a predetermined DC bias to the evaporating metallic particles, e.g., aluminum particles. With this device, aluminum particles biased negatively with respect to said semiconductor substrate are deposited on the $SiO_2$ film covering said substrate. In this way, a desired enhancement mode MOSFET is provided. The subsequent electrothermic treatment can be dispensed with.

Figure 2A:
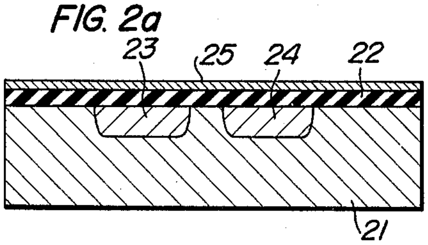
Figure 2B:
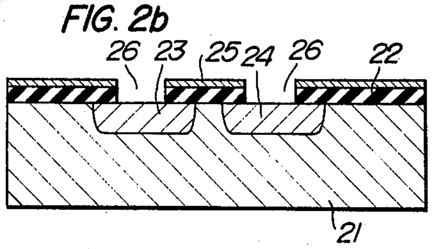
Figure 2C:
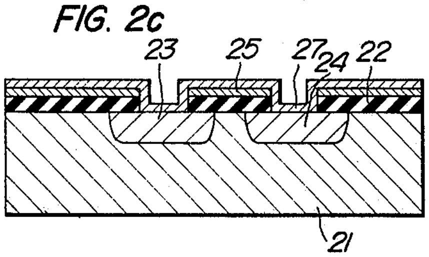
Figure 2D:
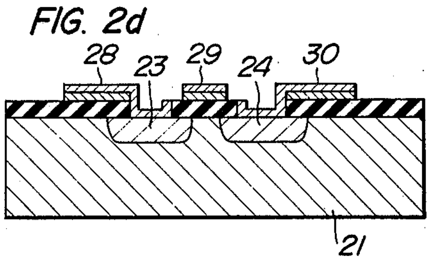

According to a yet further embodiment of this invention, the $SiO_2$ film subjected to the sulfide treatment of undiluted sulfuric acid, sulphurous acid, benzene sulfonic acid, etc. is kept away from the outer atmosphere as much as possible. This precaution is made because a better FET can be obtained when the $SiO_2$ film subjected to sulfide treatment is cleaner. FIGS. 2*a* to 2*d* show such an embodiment. After the surface of P type silicon substrate 21 comprising N type regions 23, 24 is covered with a new thermally grown $SiO_2$ film 22 and the surface of the $SiO_2$ film 22 is exposed to sulphurous acid gas, heated undiluted sulfuric acid or heated benzene sulfonic acid, a passivation film 25 consisting of aluminum is evaporated uniformly on said film 22. This state is shown in FIG. 2*a*. Then, a part of the $SiO_2$ film and the Al layer on the source region 23 and the drain region 24 is elimiated as shown in FIG. 2*b* and another aluminum layer 27 is deposited again as shown in FIG. 2*c*. Then, the aluminum layers 25 and 27 are partially photoengraved by photoetching technique and a source electrode 28, a gate electrode 29 and a drain electrode 30 are formed as shown in FIG. 2*d*. Some of the MOSFET's obtained in this way are already enhancement mode transistors even without the charging treatment of the $SiO_2$ film. Though the reason therefor is not obvious, it can be ascribed partly to a clean oxide film including sulphur. The elimination of the photoresist film to be used in said treatments can be done with benzene sulfonic acid as in said embodiments or with sulfuric acid. Briefly stated an, etchant including a sulfide is suitable for eliminating the photoresist film if an enhancement mode FET is to be obtained. Further, said special evaporator described hereinabove can be used in the two evaporation treatments in this embodiment to provide a good result. When the special evaporator is used, an enhancement mode FET can be obtained without the subsequent electrothermic treatment.

According to a further embodiment of this invention, an $SiO_2$ film is deposited on a silicon oxide film subjected to a sulfide treatment by the pyrolytic decomposition of an organo-oxysilane to protect the sulfide treated surface from the outer atmosphere. This $SiO_2$ film is a substitute for said aluminum passivation layer and otherwise the other processes of this embodiment are similar to the process of the other embodiments. According to a modified form of this embodiment, an attempt is made to let gas including phosphorous react to form a glass layer consisting of phosphorous oxide and silicon oxide before subjecting the silicon oxide film to the sulfide treatment. Thereafter the sulfide treatment is done to said glass layer. The threshold voltage of an MOSFET obtained in this way is generally lower than that of transistors provided by other methods, and the stability thereof is better. The reason why the threshold voltage is low, is ascribed to the fact that phosphorous contributes to the immobilization of ions, for example, $Na^+$ ions in the $SiO_2$ film.

Figure 7:
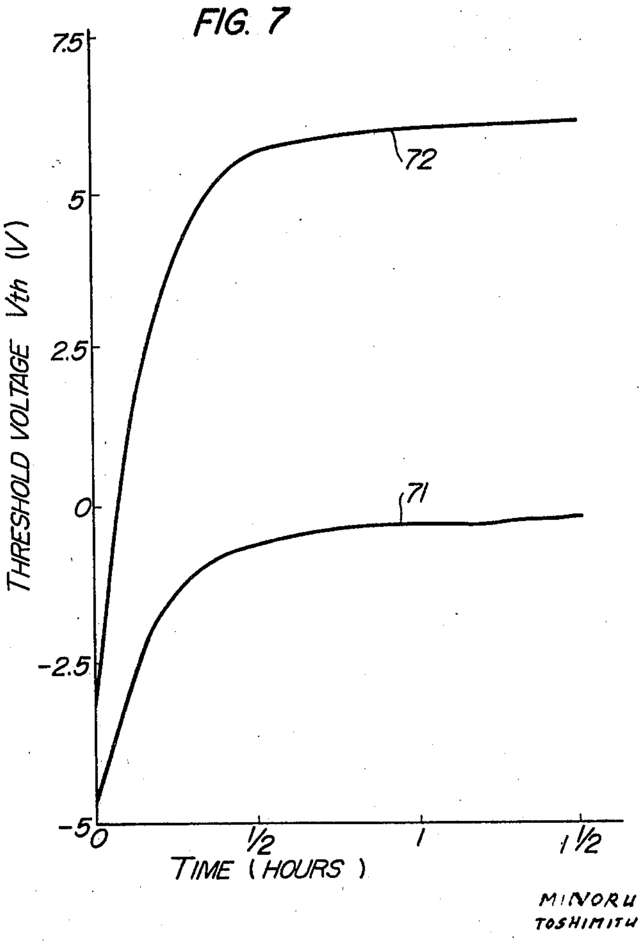
FIG. 7 is a diagram for the illustration of this invention.

Some embodiments of this invention have now been described. The most remarkable phenomenon thereof is shown in FIG. 7. Namely, the generation of a conductivity type inversion layer on the substrate surface below the insulating film is prevented or controlled easily by electrothermic treatment. Curve 71 shows the relation between the time of electrothermic treatment and the threshold voltage of an MOSFET obtained according to an example of the prior art. It is seen that the threshold voltage $V_{th}$ is always negative and the device can not be used as an enhancement mode one even if electrothermic treatment is done. However, when the sulfide treatment according to this invention is done, the tendency of the substrate surface to turn to N conductivity type is easily relieved. In FIG. 7, the positive direction from $V_{th}=0$ indicates an enhancement mode and the negative direction indicates a depletion mode. The relaxation of the tendency to turn to N type caused by sulfide treatment is attributed to the fact that superfluous negative ions neutralizing positive ions in the oxide film are introduced into the oxide film. According to this theory, P-channel depletion mode MOS-FET may be made by applying above-mentioned methods to N-type silicon substrate device.

It will be evident for those skilled in the art that the principle of this invention is not restricted to said embodiments, but can be applied equally well to an improvement of the electrical characteristics of other semiconductors comprising insulating passivation films like $SiO_2$ films, e.g. planar type transistors, diodes, etc.

We claim:

1. A semiconductor device whose surface characteristics are controlled, comprising a semiconductor substrate, an insulating film consisting mainly of a silicon inorganic compound which covers a part of the surface of said substrate, said film including sulphur, and a conducting layer placed at a part of said film surface.

2. A semiconductor device according to claim 1, wherein said substrate is made of silicon and said compound includes silicon oxide as a principal component.

3. A semiconductor device according to claim 1, wherein said silicon inorganic compound is a substance selected from the group consisting of silicon oxide and silicon nitride.

4. A semiconductor device comprising a semiconductor body and an insulating film covering a surface of said semiconductor body, said insulating film consisting essentially of silicon oxide and including a small amount of sulfur.

5. A semiconductor device according to claim 4, further comprising another insulating film covering said insulating film including sulphur.

6. A semiconductor device comprising a semiconductor body, and an insulating film consisting essentially of a silicon oxide layer covering a surface of said body, and an oxide layer consisting essentially of silicon oxide and phosphorous oxide, said silicon oxide and phosphorous oxide layer covering said insulating film, said insulating film including a small amount of sulfur.

7. A semiconductor device having controlled surface characteristics which comprises:

a silicon semiconductor substrate;

an insulating passivation film consisting essentially of a material selected from the group consisting of silicon oxide and silicon nitride covering at least a portion of said substrate;

a sulphur-inorganic silicon compound reaction product on the surface of said passivation film remote from said substrate; and a conducting layer disposed on at least a portion of the surface of said film having said sulphur-inorganic silicon compound reaction product thereon.

8. A field effect semiconductor device comprising:

a semiconductor body having a pair of regions of a conductivity type opposite to that of the adjacent semiconductor material thereof, said regions being disposed in a major surface of the body and spaced apart from each other;

a control electrode disposed over the surface portion of the body between said regions; and an insulating film interposed between the surface portion of said body and said control electrode, said insulating film consisting essentially of a silicon compound having a small amount of sulphur included therein.

9. A semiconductor device comprising a semiconductor body and an inorganic insulating film of a sulfurated silicon compound covering a surface of said semiconductor body.

10. A method of making a semiconductor device comprising the steps of covering a surface of a semiconductor substrate with a silicon inorganic compound film; exposing at least a part of said film surface to a phase including sulfur; removing the combination thus treated from said phase including sulfur; and forming a layer of a predetermined conducting material on at least that part of said film surface exposed to said phase including sulfur.

11. A method of making a semiconductor device, which comprises:

forming an inorganic silicon compound film on at least a portion of a semiconductor substrate;

treating at least a portion of said passivation film with a sulfur containing material to form a sulfur-passivation film reaction product on the treated surface of said film; and forming a conducting layer on at least a portion of said sulfur-passivation film reaction product.

12. A method according to claim 11, wherein said conducting layer is a metal.

13. A method according to claim 12, wherein a portion of said metal and the passivation film underlying that portion of said metal are removed to expose a portion of said substrate, and wherein a second metal layer is deposited on the exposed portion of said substrate.

14. A method according to claim 12, which further comprises applying a predetermined voltage across said metal layer and said substrate.

15. A method according to claim 11, which further comprises depositing another passivation film on at least a portion of said sulfur-passivation film reaction product before forming a conducting layer thereon.

16. A method according to claim 11, which further comprises treating the passivation film with a corona discharge to establish an electric charge thereon.

17. A method according to claim 11, wherein said sulfur containing material is selected from the group consisting of liquid phase undiluted sulfuric acid, gas phase sulphurous acid and liquid phase benzene sulfonic acid.

18. A method for making a semiconductor device comprising the steps of:
forming an insulating film of an inorganic silicon compound on a surface of a semiconductor body;
exposing the surface of said film to a material selected from the group consisting of undiluted sulfuric acid, sulfurous acid gas and benzene sulfonic acid; and
depositing a metal layer of the surface of said film thus treated.

19. A method according to claim 18, which includes exposing said film to liquid phase undiluted sulfuric acid.

20. A method according to claim 18, which includes exposing said film to gas phase sulfurous acid.

21. A method according to claim 18, which includes exposing said film to liquid phase benzene sulfonic acid.

22. A method according to claim 18, further comprising the steps of:
applying an etch resistant mask on a predetermined portion of said metal layer;
selectively removing the unmasked portion of said metal layer; and
exposing the resultant product to benzene sulfonic acid to remove the etch resistant mask material therefrom.

23. A method for making a semiconductor device comprising the steps of:
forming an insulating film of an inorganic silicon compound in contact with a surface of a semiconductor body;
exposing at least a portion of the surface of said film to undiluted sulfuric acid in liquid phase; and
removing the combination thus treated from said undiluted sulfuric acid.

24. A method for making a semiconductor device comprising the steps of:
forming an insulating film of an inorganic silicon compound in contact with a surface of a semiconductor body;
exposing at least a portion of the surface of said film to sulfurous acid gas; and
removing the combination thus treated from said sulfurous acid gas.

25. A method for making a semiconductor device comprising the steps of:
forming an insulating film of an inorganic silicon compound in contact with a surface of a semiconductor body;
exposing at least a portion of the surface of said film to benzene sulfonic acid in liquid phase; and
removing the combination thus treated from said benzene sulfonic acid.

26. A method according to claim 18, further comprising the steps of:
applying an etch resistant mask on a predetermined portion of said metal layer;
selectively removing the unmasked portion of said metal layer; and
exposing the resultant product to benzene sulfonic acid to remove the etch resistant mask material therefrom.

27. A method for making a semiconductor device comprising the steps of:
forming an insulating film of an inorganic silicon compound on a surface of a semiconductor body;
exposing the surface of said film to a sulfur containing compound selected from the group consisting of undiluted sulfuric acid, sulfurous acid gas and benzene sulfonic acid; and
heating the combination thus treated in an atmosphere consisting essentially of hydrogen, oxygen and nitrogen at a temperature of about 450–500° C. for several tens of minutes.

28. A method for making a semiconductor device comprising the steps of:
forming an insulating film of an inorganic silicon compound on a surface of a semiconductor body;
exposing the surface of said film to a sulfur containing compound selected from the group consisting of undiluted sulfuric acid, sulfurous acid and benzene sulfonic acid; and
heating the combination thus treated to a temperature above about 300° C. in a dry atmosphere while apply an electric field across said insulating film.

29. A method for making a semiconductor device comprising the steps of:
forming an insulating film of an inorganic silicon compound on a surface of a semiconductor body;
exposing the surface of said film to a sulfur containing material selected from the group consisting of undiluted sulfuric acid, sulfurous acid and benzene sulfonic acid;
depositing on the surface of the film thus treated a protective layer for isolating the surface from the surrounding atmosphere;
forming through said insulating film and said protective layer a hole reaching the surface of the body; and
connecting an electrode through the hole in said insulating film and said protective layer.

30. A method for making a semiconductor device comprising the steps of:
diffusing a conductivity type determining impurity into a semiconductor body of silicon through a hole in a mask disposed on a surface of the semiconductor body;
removing the mask from the surface of the semiconductor body;
oxidizing the surface of the body in a wet oxygen atmosphere;
thereafter oxidizing the surface of the body in a dry oxygen atmosphere;
exposing the thus oxidized surface of the body to a sulfur containing material selected from the group consisting of undiluted sulfuric acid, sulfurous acid and benzene sulfonic acid;
depositing aluminum on the oxide layer covering the surface of the body;
applying an etch resistant mask on a preselected portion of said aluminum layer;
removing the unmasked portion of said aluminum layer;
exposing the resultant product to benzene sulfonic acid to remove the etch resistant mask therefrom; and
washing the combination thus treated with an alcohol.

References Cited

UNITED STATES PATENTS

| | | | |
|---|---|---|---|
| 3,024,119 | 3/1962 | Flaschen et al. | 106—47 |
| 3,334,281 | 8/1967 | Ditrick | 317—235 |

JOHN W. HUCKERT, Primary Examiner

M. EDLOW, Assistant Examiner

U.S. Cl. X.R.

117—212, 213; 148—186; 317—234